US012813056B2

(12) United States Patent
Kim et al.

(10) Patent No.: US 12,813,056 B2
(45) Date of Patent: Nov. 24, 2026

(54) METHOD OF MANUFACTURING LIGHT EMITTING ELEMENT AND METHOD OF MANUFACTURING DISPLAY DEVICE

(71) Applicant: Samsung Display Co., Ltd., Yongin-si (KR)

(72) Inventors: Se Hun Kim, Yongin-si (KR); Chang Hee Lee, Yongin-si (KR); Jae Kook Ha, Yongin-si (KR); In Pyo Kim, Yongin-si (KR); Jun Bo Sim, Yongin-si (KR); Hyo Jin Ko, Yongin-si (KR); Chan Woo Joo, Yongin-si (KR); Na Mi Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 664 days.

(21) Appl. No.: 17/454,459

(22) Filed: Nov. 10, 2021

(65) Prior Publication Data

US 2022/0165786 A1 May 26, 2022

(30) Foreign Application Priority Data

Nov. 26, 2020 (KR) ........................ 10-2020-0161405

(51) Int. Cl.
*H10H 29/14* (2025.01)
*H10H 20/01* (2025.01)
(Continued)

(52) U.S. Cl.
CPC ........ *H10H 29/142* (2025.01); *H10H 20/018* (2025.01); *H10H 20/821* (2025.01);
(Continued)

(58) Field of Classification Search
CPC .. H10H 29/142; H10H 20/018; H10H 20/821; H10H 20/831; H10H 20/84;
(Continued)

(56) References Cited

U.S. PATENT DOCUMENTS 8,330,173 B2 12/2012 Kim
9,455,373 B2 9/2016 Yokozeki et al.
(Continued)

FOREIGN PATENT DOCUMENTS

JP 2013-110374 A 6/2013
KR 10-0955319 B1 4/2010
(Continued)

OTHER PUBLICATIONS

Kozuka, Hiromitsu et al, "Superior Properties of Silica Thin Films Prepared from Perhydropolysilazane Solutions at Room Temperature in Comparison with Conventional Alkoxide-Derived Silica Gel Films", ACS Applied Materials & Interfaces, 5, pp. 8329-8336 (2013).

(Continued)

*Primary Examiner* — Su C Kim
(74) *Attorney, Agent, or Firm* — Womble Bond Dickinson (US) LLP

(57) ABSTRACT

A method of manufacturing a light emitting element includes: forming a plurality of light emitting patterns on a stack substrate; forming a polysilazane layer on the plurality of light emitting patterns; forming a first insulating film by curing the polysilazane layer; and forming a second insulating film on the first insulating film. The forming of the first insulating film includes photocuring the polysilazane layer by irradiating ultraviolet rays onto the polysilazane layer. The forming of the plurality of light emitting patterns includes: forming a light emitting stack structure on the stack substrate; and etching the light emitting stack structure.

20 Claims, 9 Drawing Sheets

(51) Int. Cl.
*H10H 20/821* (2025.01)
*H10H 20/831* (2025.01)
*H10H 20/84* (2025.01)

(52) U.S. Cl.
CPC .......... *H10H 20/831* (2025.01); *H10H 20/84* (2025.01); *H10H 20/032* (2025.01); *H10H 20/034* (2025.01)

(58) Field of Classification Search
CPC .. H10H 20/032; H10H 20/034; H10H 20/857; H10H 20/819; H10H 20/01; H10W 90/00
See application file for complete search history.

(56) References Cited

U.S. PATENT DOCUMENTS

| | | | |
|---|---|---|---|
| 10,246,634 B2 | 4/2019 | Yang et al. | |
| 11,367,823 B2 | 6/2022 | Kim et al. | |
| 2011/0081769 A1* | 4/2011 | Takemura | H01L 27/1251 257/E21.085 |
| 2014/0145237 A1* | 5/2014 | Do | H10H 20/813 438/34 |
| 2014/0183044 A1* | 7/2014 | Renaudot | C25D 1/12 204/483 |
| 2017/0317228 A1 | 11/2017 | Sung | |
| 2018/0068921 A1* | 3/2018 | Wang | H01L 24/96 |
| 2018/0301594 A1* | 10/2018 | Bouvier | H10H 20/8312 |
| 2019/0077915 A1* | 3/2019 | Yun | B32B 27/34 |
| 2020/0114349 A1* | 4/2020 | Hu | G02B 1/005 |

FOREIGN PATENT DOCUMENTS

| | | |
|---|---|---|
| KR | 10-2014-0109377 A | 9/2014 |
| KR | 10-1542504 B1 | 8/2015 |
| KR | 10-2016-0116470 A | 10/2016 |
| KR | 10-1672781 B1 | 11/2016 |
| KR | 10-2018-0105873 A | 10/2018 |
| KR | 10-2019-0124359 A | 11/2019 |
| KR | 10-2058503 B1 | 12/2019 |
| KR | 10-2020-0021014 A | 2/2020 |
| WO | WO 2013/070321 A1 | 5/2013 |

OTHER PUBLICATIONS

Lee, Joo Yeon et al, "Polyurethane-silica nanocomposites provided from perhydropolysilazane: Polymerization mechanism", Polymer vol. 135, pp. 251-260 (2018).

* cited by examiner

METHOD OF MANUFACTURING LIGHT EMITTING ELEMENT AND METHOD OF MANUFACTURING DISPLAY DEVICE

CROSS-REFERENCE TO RELATED APPLICATION

This application claims priority to and the benefit of Korean Patent Application No. 10-2020-0161405 filed in the Korean Intellectual Property Office on Nov. 26, 2020, the entire content of which is incorporated herein by reference.

BACKGROUND

1. Field

One or more embodiments of the present disclosure relate to a method of manufacturing a light emitting element and a method of manufacturing a display device.

2. Description of the Related Art

Recently, as interest in information displays is increasing, research and development of display devices are continuously conducted.

SUMMARY DISCLOSURE

One or more embodiments of the present disclosure are directed toward a method of manufacturing a light emitting element, which is capable of reducing process time and cost and improving the lifetime and efficiency of the light emitting element, and a method of manufacturing a display device.

Embodiments of the present disclosure are not limited to the ones described above, and other embodiments that are not mentioned herein will be clearly understood by those of ordinary skill in the art from the following description.

A method of manufacturing a light emitting element, according to one or more embodiments, includes: forming a plurality of light emitting patterns on a stack substrate; forming a polysilazane layer on plurality of the light emitting patterns; forming a first insulating film by curing the polysilazane layer; and forming a second insulating film on the first insulating film.

The first insulating film may include silicon oxide ($SiO_x$).

The polysilazane layer may be formed by slit coating, spin coating, and/or inkjet printing.

The second insulating film may include at least one selected from the group consisting of aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

The second insulating film may be formed through a dry process.

The dry process may include at least one selected from the group consisting of atomic layer deposition (ALD), physical vapor deposition (PVD), chemical vapor deposition (CVD), and plasma enhanced chemical vapor deposition (PECVD).

The second insulating film may be formed through a wet process.

The wet process may include at least one selected from the group consisting of a sol-gel process, a dip coating process, and an electrochemical deposition process.

The first insulating film may be formed to be thinner than the second insulating film.

The method may further include thermally curing the first insulating film.

The thermally curing may be performed at a temperature of about 150° C. to about 500° C.

The forming of the first insulating film may include photocuring the polysilazane layer by irradiating ultraviolet rays to the polysilazane layer.

The forming of the light emitting patterns may include: forming a light emitting stack structure on the stack substrate; and etching the light emitting stack structure.

The light emitting stack structure may include: a first semiconductor layer; a second semiconductor layer on the first semiconductor layer; and an active layer between the first semiconductor layer and the second semiconductor layer.

A method of manufacturing a display device, according to one or more embodiments, includes: forming a first electrode and a second electrode spaced apart from each other on a substrate; and aligning a light emitting element between the first electrode and the second electrode, wherein the light emitting element is formed by: forming a plurality of light emitting patterns on a stack substrate; forming a polysilazane layer on the plurality of light emitting patterns; forming a first insulating film by curing the polysilazane layer; and forming a second insulating film on the first insulating film.

The method may further include: forming a first contact electrode to electrically couple one end of the light emitting element and the first electrode; and forming a second contact electrode to electrically couple another end of the light emitting element and the second electrode.

Each of the plurality of light emitting patterns may include: a first semiconductor layer; a second semiconductor layer on the first semiconductor layer; and an active layer between the first semiconductor layer and the second semiconductor layer.

The first insulating film may directly cover the first semiconductor layer, the second semiconductor layer, and the active layer.

The first insulating film may include silicon oxide ($SiO_x$).

The second insulating film may include at least one selected from the group consisting of aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

Further details of other embodiments are included in the detailed description and drawings.

DETAILED DESCRIPTION

Figure 1:
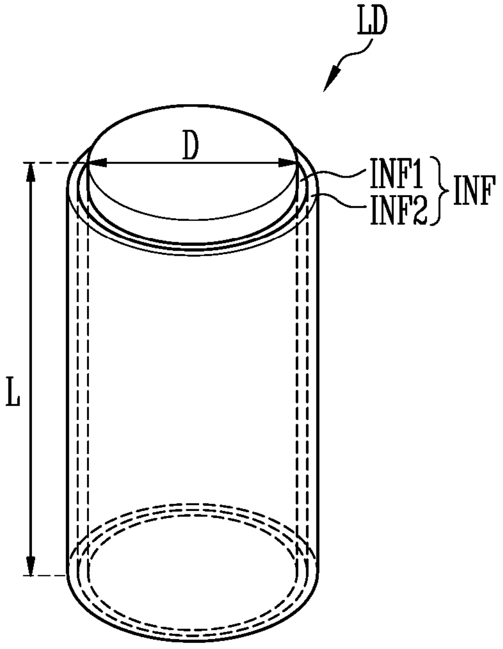
FIGS. 1 and 2 are respectively a perspective view and a cross-sectional view illustrating a light emitting element according to one or more embodiments.

Effects and features of the present disclosure, and methods of achieving them will be clarified with reference to embodiments described below in more detail with reference to the drawings. However, the present disclosure is not limited to the following embodiments and may be embodied in various forms. These embodiments are provided so that the present disclosure will be thorough and complete and will fully convey the concept of the embodiments of the present disclosure to those of ordinary skill in the art.

The terms as used in the present specification are for describing embodiments and are not intended to limit the present disclosure. As used herein, the singular form is intended to include the plural forms as well, unless context clearly indicates otherwise. It will also be understood that the terms "comprises" and/or "includes", when used herein, specify the presence of stated elements, steps, operations, and/or devices, but do not preclude the presence or addition of other elements, steps, operations, and/or devices unless otherwise defined.

In addition, the term "connection (or coupling)" may comprehensively mean a physical and/or electrical connection (or coupling). In addition, the term "connection (or coupling)" may comprehensively mean a direct or indirect connection (or coupling), and an integrated or non-integrated connection (or coupling).

When elements or layers are referred to as being "on" another element or layer, the element or layer may be directly on another element or layer (without any intervening elements or layers therebetween), or intervening elements or layers may be present between the element or layer and the other element or layer. The same or similar reference numerals refer to the same or similar elements throughout the specification and drawings.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Although the terms "first," "second," etc. are used to describe various elements, it will be understood that these elements are not limited by these terms. These terms are used to distinguish one element from another. Therefore, it will be understood that a first element mentioned below may be a second element within the technical idea of the present disclosure.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be described in more detail with reference to the accompanying drawings.

Figure 2:
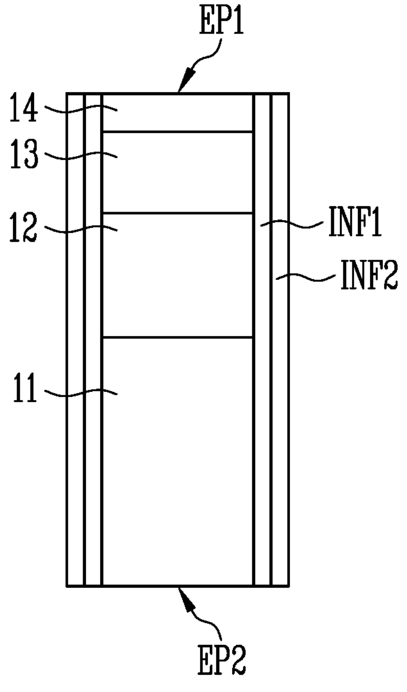

FIGS. 1 and 2 are respectively a perspective view and a cross-sectional view illustrating a light emitting element according to one or more embodiments. FIGS. 1 and 2 illustrate a pillar-shaped light emitting element LD, but the type (or kind) and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14. For example, when the extending direction of the light emitting element LD is a length (L) direction, the light emitting element LD may include the first semiconductor layer 11, the active layer 12, the second semiconductor layer 13, and/or the electrode layer 14, which are sequentially stacked along the length (L) direction.

The light emitting element LD may be formed in a pillar shape extending in one direction. The light emitting element LD may have a first end portion EP1 and a second end portion EP2. One of the first and second semiconductor layers 11 and 13 may be at the first end portion EP1 of the light emitting element LD. The other of the first and second semiconductor layers 11 and 13 may be at the second end portion EP2 of the light emitting element LD.

According to one or more embodiments, the light emitting element LD may be a light emitting element manufactured in a pillar shape through an etching process and/or the like. In the present specification, the pillar shape refers to a rod-like shape or a bar-like shape that is longer in the length (L) direction than in a width direction thereof (i.e., the aspect ratio is greater than 1), such as a cylinder or a polyprism, and the shape of the cross-section thereof is not particularly limited. For example, the length L of the light emitting element LD may be greater than the diameter D (or the width of the cross-section) thereof.

The light emitting element LD may have a small size of a nanometer scale to a micrometer scale. For example, the light emitting element LD may have a diameter D (or width) and/or a length L of a nanometer scale to a micrometer scale.

However, the size of the light emitting element LD is not limited thereto, and the size of the light emitting element LD may be variously suitably changed according to design conditions of various devices (e.g., a display device) using the light emitting element LD as a light source.

The first semiconductor layer 11 may be a semiconductor layer of a first conductivity type. For example, the first semiconductor layer 11 may include an n-type semiconductor layer. For example, the first semiconductor layer 11 may include one semiconductor material selected from InAlGaN, GaN, AlGaN, InGaN, AlN, and InN, and may include an n-type semiconductor layer doped with a first conductivity type dopant such as Si, Ge, and/or Sn. However, the material constituting the first semiconductor layer 11 is not limited thereto, and the first semiconductor layer 11 may include various other suitable materials.

The active layer 12 may be between the first semiconductor layer 11 and the second semiconductor layer 13, and may be formed in a single-quantum well structure or a multi-quantum well structure. The position of the active layer 12 may be variously suitably changed according to the type of the light emitting element LD. A clad layer doped with a conductive dopant may be formed above and/or below the active layer 12. For example, the clad layer may include AlGaN and/or InAlGaN. According to one or more embodiments, a material such as AlGaN and/or InAlGaN may be used to form the active layer 12. However, the material constituting the active layer 12 is not limited thereto, and various other suitable materials may be used to form the active layer 12.

The second semiconductor layer 13 may be on the active layer 12, and may include a semiconductor layer of a different type from the first semiconductor layer 11. For example, the second semiconductor layer 13 may include a p-type semiconductor layer. For example, the second semiconductor layer 13 may include one semiconductor material selected from InAlGaN, GaN, AlGaN, InGaN, AlN, and InN, and may include a p-type semiconductor layer doped with a second conductivity type dopant such as Mg. However, the material forming the second semiconductor layer 13 is not limited thereto, and the second semiconductor layer 13 may include various other suitable materials.

When a voltage equal to or higher than a threshold voltage is applied to both ends of the light emitting element LD, electron-hole pairs are recombined in the active layer 12 to cause the light emitting element LD to emit light. By controlling the light emission of the light emitting element LD using this principle, the light emitting element LD may be used as light sources for various suitable light emitting devices including pixels of a display device.

The electrode layer 14 may be on the first end portion EP1 and/or the second end portion EP2 of the light emitting element LD. Although FIG. 2 illustrates a case in which the electrode layer 14 is formed on the second semiconductor layer 13, the present disclosure is not limited thereto. For example, a separate electrode layer may be further provided on the first semiconductor layer 11.

The electrode layer 14 may include a transparent metal and/or a transparent metal oxide. For example, the electrode layer 14 may include at least one selected from the group consisting of indium tin oxide (ITO), indium zinc oxide (IZO), zinc oxide (ZnO), and zinc tin oxide (ZTO), but the present disclosure is not necessarily limited. As such, when the electrode layer 14 includes a transparent metal and/or a transparent metal oxide, light generated in the active layer 12 of the light emitting element LD may pass through the electrode layer 14 and may be emitted to the outside of the light emitting element LD.

The light emitting element LD may further include a first insulating film INF1 formed on the surface thereof. The first insulating film INF1 may surround the first semiconductor layer 11, the active layer 12, the second semiconductor layer 13, and/or the electrode layer 14. The first insulating film INF1 may be directly on the first semiconductor layer 11, the active layer 12, the second semiconductor layer 13, and/or the electrode layer 14. The first insulating film INF1 may expose the first and second end portions EP1 and EP2 of the light emitting element LD having different polarities. The thickness of the first insulating film INF1 may be about 5 nm to about 200 nm. In one or more embodiments, the thickness of the first insulating film INF1 may be about 20 nm to about 200 nm, but the present disclosure is not limited thereto.

In one or more embodiments, the first insulating film INF1 may include silicon oxide ($SiO_x$). For example, polysilazane may be cured to form the first insulating film INF1 including silicon oxide ($SiO_x$). In one or more embodiments, the polysilazane may be perhydropolysilazane (PHPS), but the present disclosure is not limited thereto. When the first insulating film INF1 is formed by curing polysilazane, the process time may be minimized or reduced, and the cost may be reduced. In addition, because surface defects of the first semiconductor layer 11, the active layer 12, and the second semiconductor layer 13 may be minimized or reduced, the lifetime and efficiency of the light emitting element LD may be improved. A more detailed description thereof will be provided below with reference to FIGS. 6 to 8. However, the material or the manufacturing method of the first insulating film INF1 is not necessarily limited thereto.

A second insulating film INF2 may be further provided on the first insulating film INF1. The second insulating film INF2 may surround the first insulating film INF1. The second insulating film INF2 may be directly on the surface of the first insulating film INF1. The second insulating film INF2 may expose the first and second end portions EP1 and EP2 of the light emitting element LD having different polarities. The thickness of the second insulating film INF2 may be about 5 nm to about 200 nm. In one or more embodiments, the thickness of the second insulating film INF2 may be about 40 nm to about 200 nm, but the present disclosure is not limited thereto. According to one or more embodiments, the thickness of the second insulating film INF2 may be greater than that of the first insulating film INF1, but the present disclosure is not limited thereto.

In one or more embodiments, the second insulating film INF2 may include at least one selected from the group consisting of aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). For example, the second insulating film INF2 may be formed through a dry process or a wet process. A more detailed description thereof will be described below with reference to FIG. 9. However, the material or the manufacturing method of the second insulating film INF2 is not necessarily limited thereto. When the second insulating film INF2 is formed on the first insulating film INF1, the active layer 12 may prevent or reduce the risk of a short-circuit in at least one electrode (e.g., at least one of contact electrodes connected to both ends of the light emitting element LD) and/or the like. Therefore, electrical stability of the light emitting device LD may be ensured or improved.

Although the pillar-shaped light emitting element LD is illustrated in FIGS. 1 and 2, the type (or kind), structure, and/or shape of the light emitting element LD may be variously suitably changed. For example, the light emitting element LD may be formed in a core-shell structure having a truncated cone or a truncated pyramid shape.

A light emitting device including the light emitting element LD described above may be used in various suitable types (or kinds) of devices that require a light source, including a display device. For example, a plurality of light emitting elements LD may be positioned in each pixel of the display panel, and the light emitting elements LD may be used as a light source of each pixel. However, the field of application of the light emitting element LD is not limited to the above-described examples. For example, the light emitting element LD may be used in other types (or kinds) of electronic devices that require a light source, such as a lighting device.

FIGS. 3 to 11 are cross-sectional views illustrating process steps of a method of manufacturing a light emitting element according to one or more embodiments. Hereinafter, the same or similar reference numerals are assigned to elements that are substantially the same as those of FIGS. 1 and 2, and duplicative descriptions of these elements will not be provided.

Figure 3:
FIGS. 3-11 are cross-sectional views illustrating process steps of a method of manufacturing a light emitting element according to one or more embodiments.

Referring to FIG. 3, first, a stack substrate 1 configured to support a light emitting element LD is prepared. The stack substrate 1 may include a sapphire substrate and a transparent substrate such as glass. However, the present disclosure is not limited thereto, and the stack substrate 1 may be a conductive substrate such as GaN, SiC, ZnO, Si, GaP, and/or GaAs. Hereinafter, a case in which the stack substrate 1 is a sapphire substrate will be described. The thickness of the stack substrate 1 is not particularly limited, but as an example, the thickness of the stack substrate 1 may be about 400 μm to 1,500 μm.

Figure 4:

Referring to FIG. 4, a light emitting stack structure LDs is formed on the stack substrate 1. The light emitting stack structure LDs may be formed by growing seed crystals by an epitaxial method. According to one or more embodiments, the light emitting stack structure LDs may be formed by electron beam deposition, physical vapor deposition (PVD), chemical vapor deposition (CVD), plasma laser deposition (PLD), dual-type thermal evaporation, sputtering, and/or metal organic chemical vapor deposition (MOCVD). For example, the light emitting stack structure may be formed by MOCVD, but the present disclosure is not limited thereto.

A precursor material for forming the light emitting stack structure LDs is not particularly limited and may be any suitable material that may be selected so as to form a target material. For example, the precursor material may be a metal precursor including an alkyl group such as a methyl group and/or an ethyl group. For example, the precursor material may be a compound such as trimethyl gallium ($Ga(CH_3)_3$), trimethyl aluminum ($Al(CH_3)_3$), and/or triethyl phosphate ($(C_2H_5)_3PO_4$), but the present disclosure is not limited thereto. The light emitting stack structure LDs may include a first semiconductor layer 11, an active layer 12, a second semiconductor layer 13, and an electrode layer 14, which are sequentially stacked. Because the first semiconductor layer 11, the active layer 12, the second semiconductor layer 13, and the electrode layer 14 have been described above with reference to FIGS. 1 and 2, redundant descriptions thereof are not provided again.

In one or more embodiments, a buffer layer and/or a sacrificial layer may be further provided between the stack substrate 1 and the first semiconductor layer 11. The buffer layer may serve to reduce a difference in lattice constants between the stack substrate 1 and the first semiconductor layer 11. For example, the buffer layer may include an undoped semiconductor, may include substantially the same material as that of the first semiconductor layer 11, and may be a material not doped with n-type or p-type dopant. In one or more embodiments, the buffer layer may be at least one selected from the group consisting of InAlGaN, GaN, AlGaN, InGaN, AlN, and InN, each of which is undoped, but the present disclosure is not limited thereto. The sacrificial layer may include a material capable of smoothly or suitably growing the crystal of the semiconductor layer in a subsequent process. The sacrificial layer may include at least one selected from the group consisting of an insulating material and a conductive material. For example, the sacrificial layer may include silicon oxide ($SiO_x$), silicon nitride ($SiN_x$), and/or silicon oxynitride ($SiO_xN_y$) as the insulating material, and may include ITO, IZO, IGO, ZnO, graphene, and/or graphene oxide as the conductive material, but the present disclosure is not limited thereto.

Figure 5:
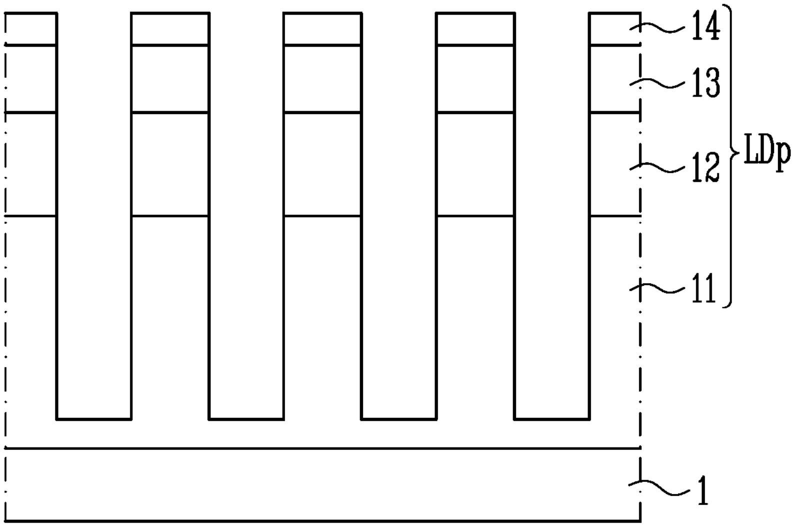

Referring to FIG. 5, a plurality of light emitting patterns LDp are formed by etching the light emitting stack structure LDs in a direction perpendicular to the extension direction of the stack substrate 1. The process of etching the light emitting stack structure LDs may be performed by any suitable method. For example, the etching process may be dry etching, wet etching, reactive ion etching (RIE), and/or inductively coupled plasma reactive ion etching (ICP-RIE). In the case of the dry etching, anisotropic etching is possible, and thus the dry etching may be suitable for vertical etching. When using the above-described etching method, an etchant may be $Cl_2$ and/or $O_2$, but the present disclosure is not limited thereto.

Figure 6:
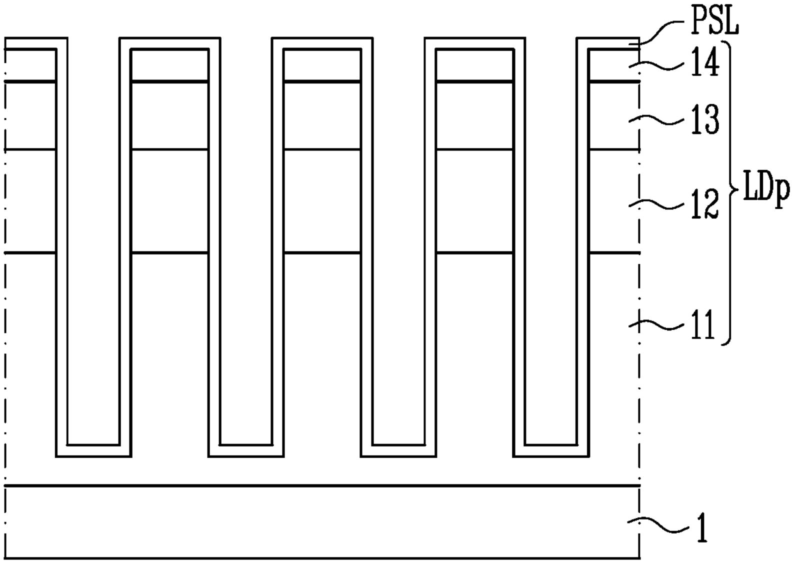

Referring to FIG. 6, a polysilazane layer PSL is formed on the surfaces of the plurality of light emitting patterns LDp. The polysilazane layer PSL may be formed by dispersing polysilazane in a solvent, coating the resulting mixture on the light emitting pattern LDp, and then removing the solvent. In one or more embodiments, the polysilazane may be perhydropolysilazane (PHPS), but the present disclosure is not limited thereto. The solvent may be toluene, benzene, tetrahydrofuran, hexane, and/or xylene, but the present disclosure is not limited thereto. In one or more embodiments, the polysilazane layer PSL may be formed by slit coating, spin coating, and/or inkjet printing, but the present disclosure is not limited thereto.

Figure 7:
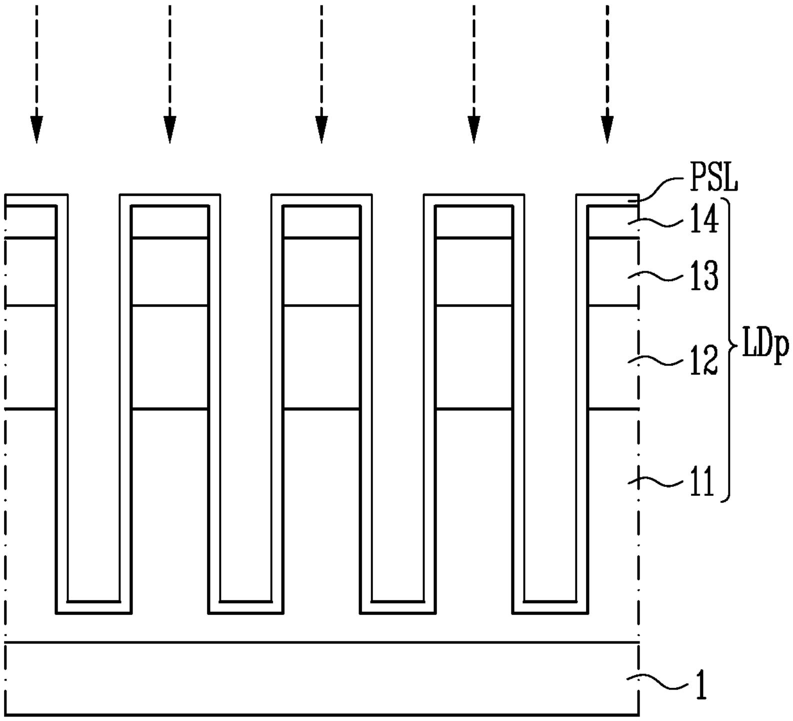
Figure 8:
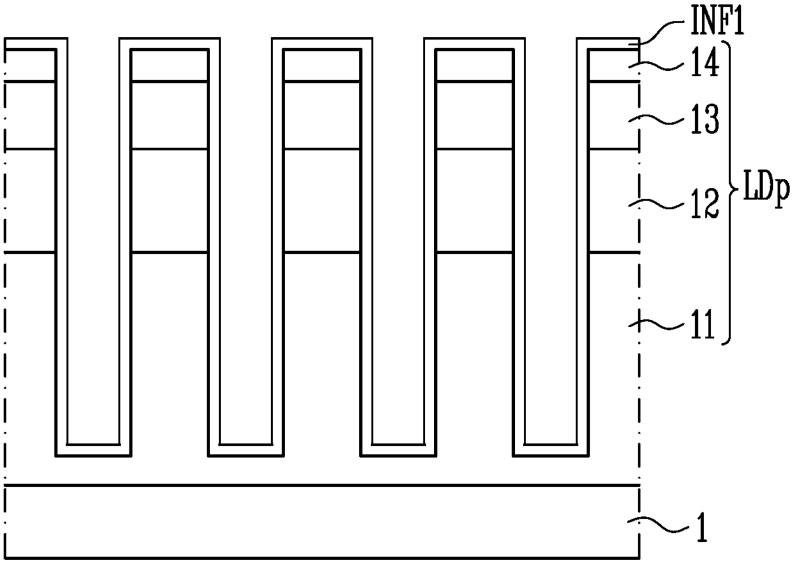

Referring to FIGS. 7 and 8, the polysilazane layer PSL is cured to form a first insulating film INF1. The polysilazane layer PSL may be cured by one or more suitable methods such as photocuring, thermal curing, and/or steam treatment, and by way of example, the following description will be given focusing on the photocuring of the polysilazane layer PSL.

As the photocuring is performed by irradiating the polysilazane layer PSL with ultraviolet rays, Si—H and Si—N bonds of the polysilazane layer PSL are converted into Si—O bonds, and the first insulating film INF1 including silicon oxide ($SiO_x$) may be formed. At this time, the conversion rate and conversion speed at which the polysilazane layer PSL is converted into the first insulating film INF1 may be changed according to processing conditions (temperature, humidity, etc.). For example, the curing of the polysilazane layer PSL may proceed more rapidly under high temperature and high humidity conditions. In one or more embodiments, when irradiating ultraviolet rays using a strong xenon excimer lamp (172 nm, 3000 mJ/cm$^2$), ambient oxygen ($O_2$) is converted into reactive oxygen species by strong ultraviolet rays, and perhydropolysilazane of the polysilazane layer PSL may rapidly react with ambient active oxygen and may be converted into the first insulating film INF1. However, the present disclosure is not necessarily limited thereto, and various suitable photocuring methods may be applied. For example, the polysilazane layer PSL may be cured using a low-pressure mercury lamp or ozone lamp (189 nm (10%), 254 nm (90%), respectively).

The first insulating film INF1 formed by curing the polysilazane layer PSL is excellent in (has improved characteristics such as) adhesion, chemical resistance, and/or moisture resistance. Therefore, it is possible to prevent or reduce the occurrence of voids and leakage currents during the process of atomic layer deposition (ALD), chemical vapor deposition (CVD), and/or physical vapor deposition (PVD). For example, because surface defects of the first semiconductor layer 11, the active layer 12, and/or the second semiconductor layer 13 may be minimized or reduced, the lifetime and efficiency of the light emitting element LD may be improved, as described above.

According to one or more embodiments, after the photocuring of the polysilazane layer PSL, thermal curing may be further included. At this time, the thermal curing may be performed in conditions (e.g., at a temperature) of 150° C. to 500° C., but the present disclosure is not limited thereto. In some embodiments, the thermal curing may be omitted.

Figure 9:
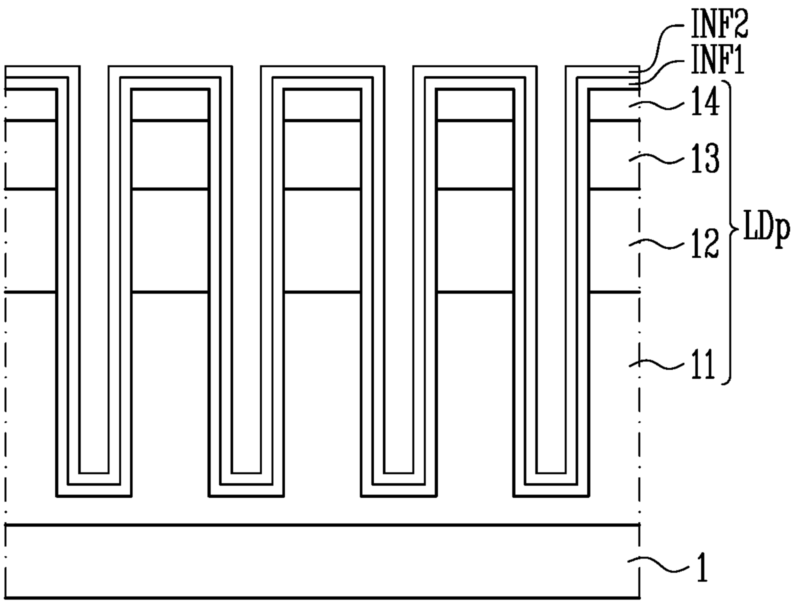

Referring to FIG. 9, a second insulating film INF2 is formed on the first insulating film INF1. In one or more embodiments, the second insulating film INF2 may be formed through a dry process. The dry process may include at least one selected from the group consisting of atomic layer deposition (ALD), physical vapor deposition (PVD), chemical vapor deposition (CVD), and plasma enhanced chemical vapor deposition (PECVD), but the present disclosure is not limited thereto. In one or more other embodiments, the second insulating film INF2 may be formed through a wet process. The wet process may include at least one selected from the group consisting of a sol-gel process, a dip coating process, and an electrochemical deposition process, but the present disclosure is not limited thereto.

The second insulating film INF2 may include at least one selected from the group consisting of aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$), but the present disclosure is not necessarily limited thereto.

Figure 10:
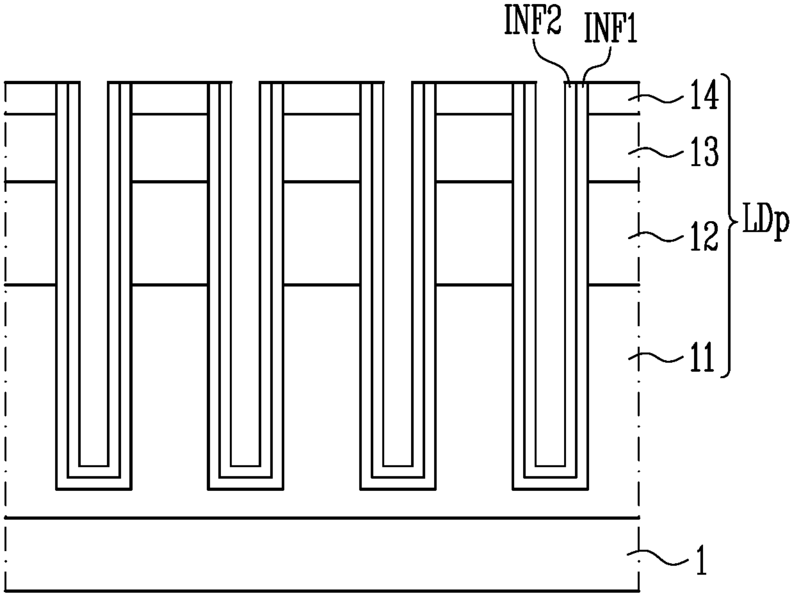

Referring to FIG. 10, the first and second insulating films INF1 and INF2 are partially removed so that the upper surface of the electrode layer 14 is exposed. In the process of etching the first and second insulating films INF1 and INF2, not only the upper surface of the electrode layer 14, but also the side surface of the electrode layer 14, may be partially exposed.

Figure 11:
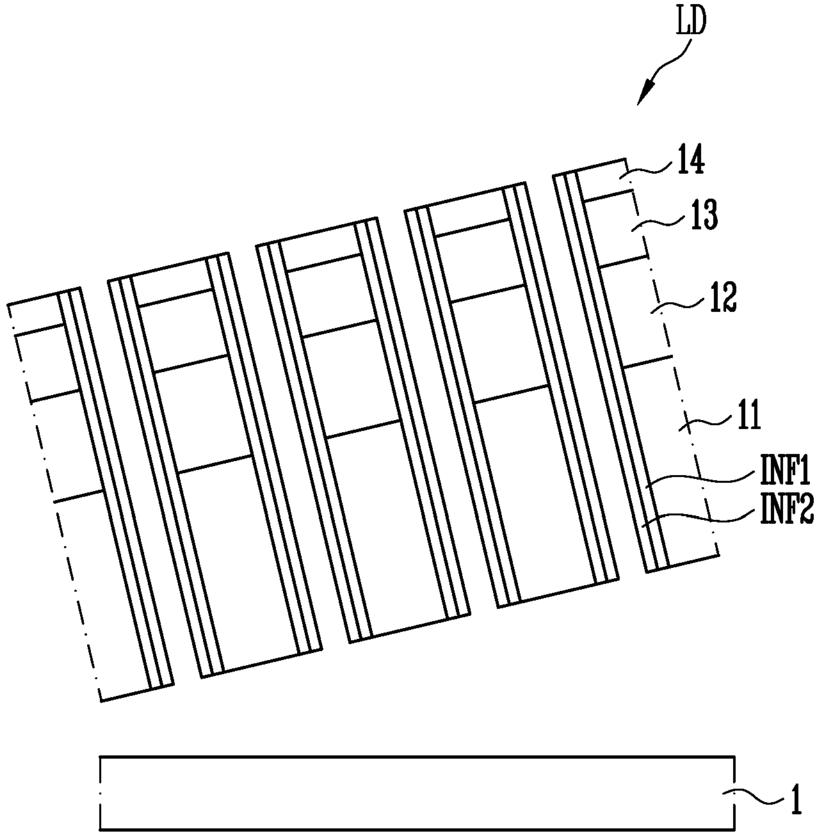

Referring to FIG. 11, a plurality of light emitting elements LD may be manufactured by separating the plurality of light emitting patterns LDp from the stack substrate 1. In the method of manufacturing the light emitting element LD according to the above-described embodiment, the first insulating film INF1 is formed by curing the polysilazane layer PSL, thereby shortening the process time and reducing the cost. In addition, because the adhesion, chemical resistance, and moisture resistance of the first insulating film INF1 may be improved, surface defects of the first semiconductor layer 11, the active layer 12, and the second semiconductor layer 13 may be minimized or reduced, thereby improving the lifetime and efficiency of the light emitting element LD, as described above.

Hereinafter, the photoluminescence intensity (PL intensity) for Examples and Comparative Examples will be described with reference to Table 1 and Table 2.

TABLE 1

| Example/Comparative Example | First insulating film | Second insulating film |
|---|---|---|
| Example 1 | $SiO_2$(20 nm)/PHPS curing | $Al_2O_3$(40 nm)/dry |
| Example 2 | $SiO_2$(20 nm)/PHPS curing | $SiO_2$(40 nm)/dry |
| Example 3 | $SiO_2$(20 nm)/PHPS curing | $Al_2O_3$(40 nm)/wet |
| Example 4 | $SiO_2$(20 nm)/PHPS curing | $SiO_2$(40 nm)/wet |
| Comparative Example 1 | $SiO_2$(20 nm)/dry | $Al_2O_3$(40 nm)/dry |
| Comparative Example 2 | $SiO_2$(20 nm)/dry | $SiO_2$(40 nm)/dry |
| Comparative Example 3 | $SiO_2$(20 nm)/dry | $Al_2O_3$(40 nm)/wet |
| Comparative Example 4 | $SiO_2$(20 nm)/dry | $SiO_2$(40 nm)/wet |
| Comparative Example 5 | $SiO_2$(20 nm)/wet | $Al_2O_3$(40 nm)/dry |
| Comparative Example 6 | $SiO_2$(20 nm)/wet | $SiO_2$(40 nm)/dry |
| Comparative Example 7 | $SiO_2$(20 nm)/wet | $Al_2O_3$(40 nm)/wet |
| Comparative Example 8 | $SiO_2$(20 nm)/wet | $SiO_2$(40 nm)/wet |

TABLE 2

| Example/Comparative Example | PL intensity in the 445 nm region | PL intensity in the 560 nm region |
|---|---|---|
| Example 1 | 84 | 0.32 |
| Example 2 | 90 | 0.35 |
| Example 3 | 96 | 0.40 |
| Example 4 | 87 | 0.42 |
| Comparative Example 1 | 1 | 1 |
| Comparative Example 2 | 1.05 | 0.95 |
| Comparative Example 3 | 1.08 | 0.90 |
| Comparative Example 4 | 0.98 | 1.15 |
| Comparative Example 5 | 52 | 0.52 |
| Comparative Example 6 | 60 | 0.54 |
| Comparative Example 7 | 55 | 0.49 |
| Comparative Example 8 | 58 | 0.55 |

Manufacturing Example

An example of a method of forming a first insulating film using perhydropolysilazane (PHPS) is as follows. First, a wafer in which light emitting elements LD were formed in a vertical direction at regular intervals was prepared, washed with deionized water (DI), and dried and pre-heated at 100° C. for 10 minutes. Thereafter, a diphenyl ether (DPE) or dibutyl ether (DBE) solution in which perhydropolysilazane was dissolved in a concentration of 0.5% to 2% was spin-coated at a speed of 3000 rpm to 10,000 rpm for 5 to 60 seconds. At this time, in order to evenly (or substantially evenly) coat perhydropolysilazane on the surfaces of the light emitting elements LD, the optimization was performed by changing the spin coating conditions (rpm, time, etc.) according to the height, thickness, and interval of the light emitting elements LD. The spin-coated wafer was pre-baked by heating at 100° C. to 200° C. for 10 minutes, and then E-UV (3000 mJ) at a wavelength of 172 nm was irradiated thereon for 10 seconds to 300 seconds. Thereafter, the wafer was heated at 100° C. to 200° C. for 10 minutes for removal of the residual solvent and post-baking.

Referring to Table 1, Examples 1 to 4 are light emitting elements including a first insulating film INF1 formed by curing perhydropolysilazane (PHPS), and Comparative Examples 1 to 8 are light emitting elements including the first insulating film formed by a related art dry process or wet process. Referring to Table 2, the PL intensities of Examples 1 to 4 and Comparative Examples 1 to 8 were compared, the PL intensities in the 445 nm region and the 560 nm region were measured, and relative intensities are shown. For example, the PL intensity in the 445 nm region may refer to the normal PL intensity of the light emitting element, and the PL intensity in the 560 nm region may refer to the PL intensity generated by a surface defect (e.g., Ga vacancy) of the light emitting element. Examples 1 to 4 in the 445 nm region exhibited relatively high PL intensity of 84 to 96, and it was confirmed that the PL intensity was improved compared to Comparative Examples 1 to 8. In addition, Examples 1 to 4 in the 560 nm region exhibited relatively low PL intensity of 0.32 to 0.42, and it was confirmed that surface defects were improved compared to Comparative Examples 1 to 8. Without being bound by any particular theory, it is believed that in the embodiments that included the first insulating film INF1 formed by curing perhydropolysilazane according to Examples 1 to 4, the PL efficiency was improved by minimizing or reducing surface defects of the light emitting element LD.

Next, a method of manufacturing a display device including a light emitting element according to the above-described embodiments will be described.

Figure 12:
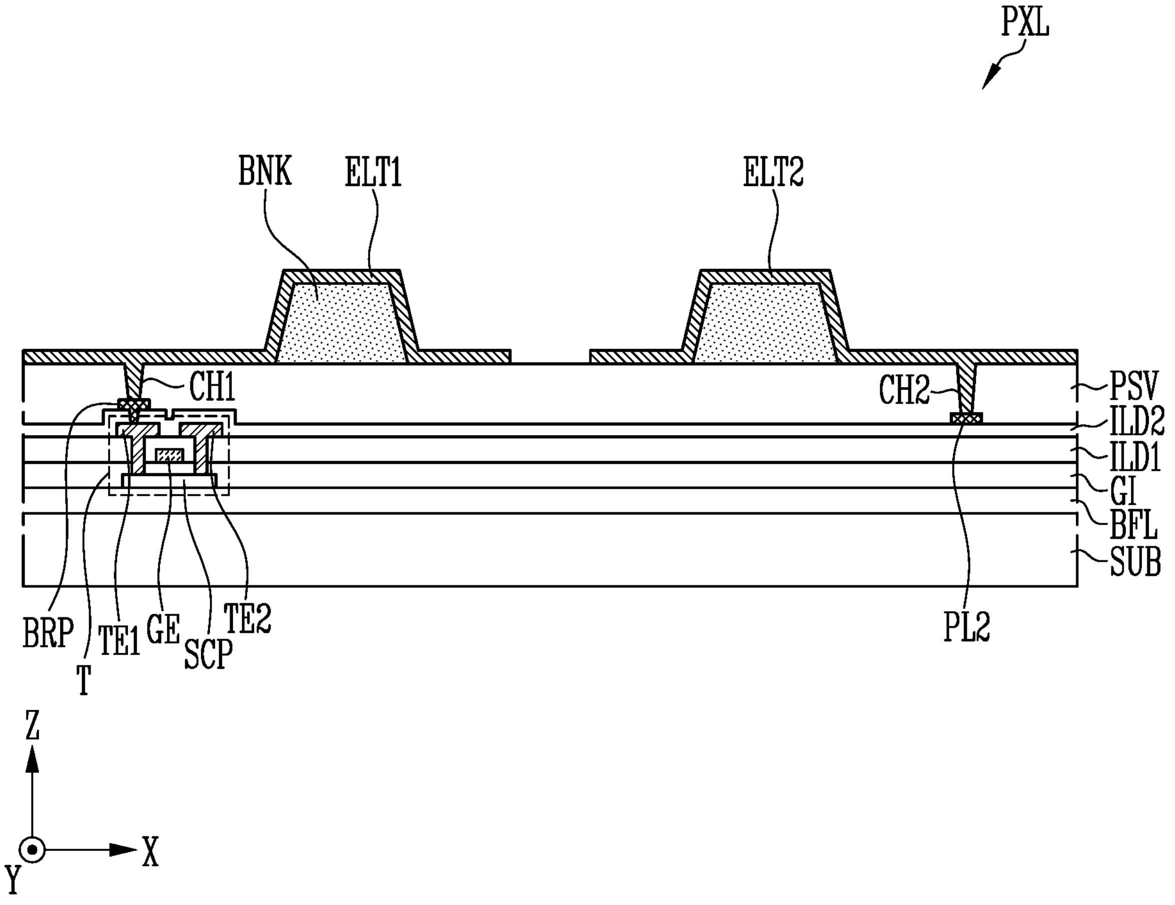
FIGS. 12-14 are cross-sectional views illustrating process steps of a method of manufacturing a display device according to one or more embodiments.
Figure 13:
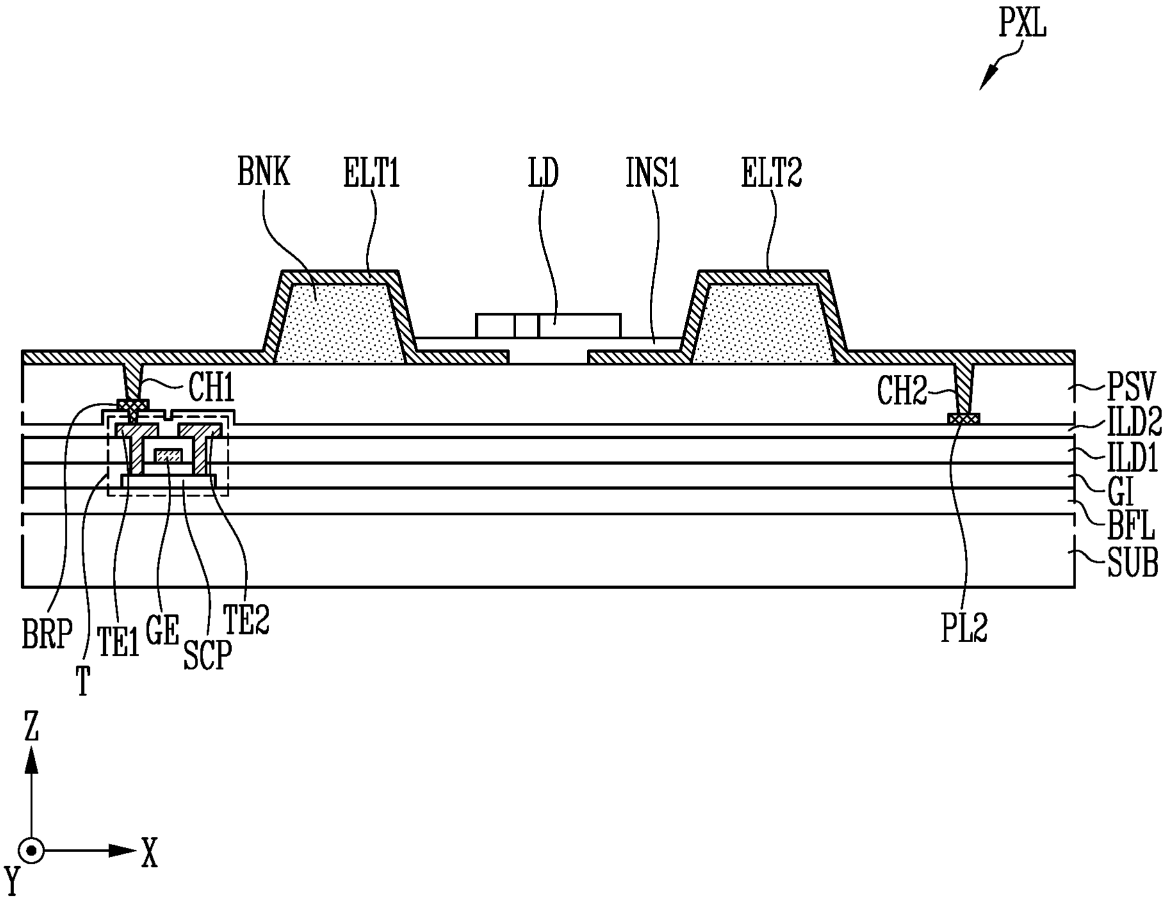
Figure 14:
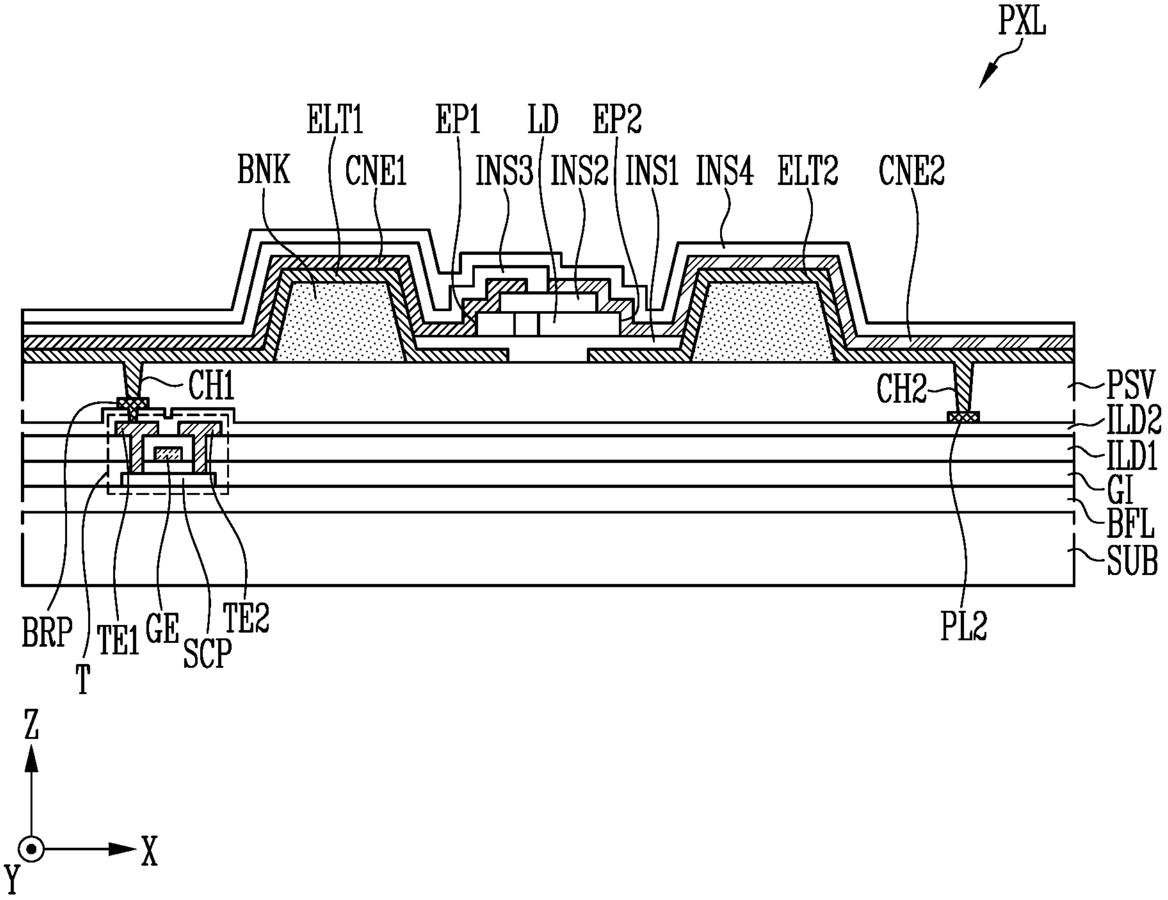

FIGS. 12 to 14 are cross-sectional views illustrating process steps of a method of manufacturing a display device according to one or more embodiments. FIGS. 12 to 14 are cross-sectional views illustrating a method of manufacturing a display device including the light emitting element LD described above with reference to FIGS. 1 to 11. In particular, FIGS. 12 to 14 mainly illustrate a pixel PXL provided in the display device.

Referring to FIG. 12, a substrate SUB on which a transistor T and/or the like are formed is prepared, and banks BNK and first and second electrodes ELT1 and ELT2 are formed on the substrate SUB in which a plurality of pixels PXL are defined. In FIG. 12, a transistor T connected to the first electrode ELT1 among various circuit elements is illustrated. However, the structure of the transistors T and/or the location of each layer are not limited to the embodiment illustrated in FIG. 12 and the like, and may be variously suitably changed according to embodiments.

The substrate SUB constitutes a base member, and may be a rigid or flexible substrate and/or film. For example, the substrate SUB may be a rigid substrate including glass and/or tempered glass, a flexible substrate (e.g., a thin film) including plastic and/or metal, and/or may include at least one insulating layer. The material and/or physical properties of the substrate SUB are not particularly limited. In one or more embodiments, the substrate SUB may be substantially transparent. The term "substantially transparent" may mean that light may be transmitted through, for example, a substantially transparent material at more than a set or predetermined transmittance. In one or more other embodiments, the substrate SUB may be translucent or opaque. In one or more embodiments, the substrate SUB may include a reflective material according to one or more embodiments.

A buffer layer BFL may be formed on the substrate SUB. The buffer layer BFL may prevent or reduce the diffusion of impurities into each circuit element. The buffer layer BFL may be provided with a single layer, or may be provided with at least two or more multiple layers. When the buffer layer BFL includes multiple layers, each layer may include the same material or may include different materials. Various circuit elements, such as the transistors T and/or various lines connected (e.g., coupled) to the circuit elements, may be on the buffer layer BFL. The buffer layer BFL may be omitted according to one or more embodiments.

The transistor T may include a semiconductor pattern SCP, a gate electrode GE, and first and second transistor electrodes TE1 and TE2. Although FIGS. 12 to 14 illustrate an embodiment in which the transistor T includes the first and second transistor electrodes TE1 and TE2 formed separately from the semiconductor pattern SCP, the present disclosure is not limited thereto. For example, in one or more other embodiments, the first and/or second transistor electrodes TE1 and TE2 provided in at least one transistor T may be integrated (e.g., may be integrally formed) with each semiconductor pattern SCP.

The semiconductor pattern SCP may be formed on the buffer layer BFL. For example, the semiconductor pattern SCP may be between the substrate SUB on which the buffer layer BFL is formed and a gate insulating layer GI. The semiconductor pattern SCP may include a first region in contact with the first transistor electrode TE1, a second region in contact with the second transistor electrode TE2, and a channel region between the first and second regions. According to one or more embodiments, one of the first and second regions may be a source region, and the other thereof may be a drain region.

According to one or more embodiments, the semiconductor pattern SCP may be a semiconductor pattern including polysilicon, amorphous silicon, oxide semiconductor, and/or the like. In one or more embodiments, the channel region of the semiconductor pattern SCP may be a semiconductor pattern that is not doped with impurities and may be an intrinsic semiconductor, and each of the first and second regions of the semiconductor pattern SCP may be a semiconductor pattern that is doped with set or predetermined impurities.

The gate insulating layer GI may be formed on the semiconductor pattern SCP. For example, the gate insulating layer GI may be between the semiconductor pattern SCP and the gate electrode GE. The gate insulating layer GI may be provided with a single layer or multiple layers, and may include one or more suitable types (or kinds) of organic/inorganic insulating materials including silicon nitride ($SiN_x$), silicon oxide ($SiO_x$), and/or silicon oxynitride ($SiO_xN_y$).

The gate electrode GE may be formed on the gate insulating layer GI. For example, the gate electrode GE may overlap the semiconductor pattern SCP with the gate insulating layer GI therebetween.

A first interlayer insulating layer ILD1 may be formed on the gate electrode GE. For example, the first interlayer insulating layer ILD1 may be between the gate electrode GE and the first and second transistor electrodes TE1 and TE2. The first interlayer insulating layer ILD1 may be provided with a single layer or multiple layers, and may include at least one inorganic insulating material and/or at least one organic insulating material. For example, the first interlayer insulating layer ILD1 may include one or more suitable types (e.g., kinds) of organic/inorganic insulating materials, such as silicon nitride ($SiN_x$), silicon oxide ($SiO_x$), and/or silicon oxynitride ($SiO_xN_y$), but the material constituting the first interlayer insulating layer ILD1 is not particularly limited.

The first and second transistor electrodes TE1 and TE2 may each be formed on the semiconductor pattern SCP with at least one first interlayer insulating layer ILD1 therebetween. For example, the first and second transistor electrodes TE1 and TE2 may be formed on different end portions of the semiconductor pattern SCP with the gate insulating layer GI and the first interlayer insulating layer ILD1 therebetween. The first and second transistor electrodes TE1 and TE2 may be electrically connected (e.g., electrically coupled) to the semiconductor patterns SCP, respectively. For example, the first and second transistor electrodes TE1 and TE2 may be connected (e.g., coupled) to the first and second regions of the semiconductor pattern SCP through contact holes passing through the gate insulating layer GI and the first interlayer insulating layer ILD1. According to one or more embodiments, one of the first and second transistor electrodes TE1 and TE2 may be a source electrode, and the other thereof may be a drain electrode.

The transistor T may be connected (e.g., coupled) to at least one pixel electrode. For example, the transistor T may be electrically connected (e.g., electrically coupled) to the first electrode ELT1 of the pixel PXL through a contact hole (e.g., a first contact hole CH1) and/or a bridge pattern BRP passing through a protective layer PSV.

First and/or second power lines PL1 and PL2 may be formed in the same layer as the gate electrodes GE of the transistor T, or the first and second transistor electrodes TE1 and TE2, or may be formed in different layers therefrom. For example, the second power line PL2 for supplying the second power may be on a second interlayer insulating layer ILD2 and at least partially covered by the protective layer PSV. The second power line PL2 may be electrically connected (e.g., electrically coupled) to the second electrode ELT2 on the protective layer PSV through a second contact hole CH2 passing through the protective layer PSV. However, the positions and/or structures of the first and/or second power lines PL1 and PL2 may be variously suitably changed.

The second interlayer insulating layer ILD2 may be formed on the first interlayer insulating layer ILD1 and may cover the first and second transistor electrodes TE1 and TE2 positioned on the first interlayer insulating layer ILD1. The second interlayer insulating layer ILD2 may be provided with a single layer or multiple layers, and may include at least one inorganic insulating material and/or at least one organic insulating material. For example, the second interlayer insulating layer ILD2 may include one or more suitable types (or kinds) of organic/inorganic insulating materials, including silicon nitride ($SiN_x$), silicon oxide ($SiO_x$), and/or silicon oxynitride ($SiO_xN_y$), and the present disclosure is not necessarily limited thereto.

The bridge pattern BRP for electrically connecting the transistor T and the first electrode ELT1, the first power line PL1, and/or the second power line PL2 may be formed on the second interlayer insulating layer ILD2. However, the second interlayer insulating layer ILD2 may be omitted according to one or more embodiments.

The protective layer PSV may be formed on the circuit elements including the transistors T and/or the lines including the first power line PL1 and/or the second power line PL2. The protective layer PSV may be provided with a single layer or multiple layers, and may include at least one inorganic insulating material and/or at least one organic insulating material. For example, the protective layer PSV may include at least an organic insulating layer and may serve to substantially planarize the surface of the circuit layer including the transistors T and/or the lines.

The bank BNK protruding in a third direction (Z-axis direction) may be formed on the protective layer PSV. The bank BNK may be formed in a separate or integral pattern.

The bank BNK may have various suitable shapes according to one or more embodiments. In one or more embodiments, the bank BNK may be a bank structure having a positive taper structure (e.g., a trapezoidal structure). For example, the bank BNK may be formed to have an inclined surface inclined at a certain angle with respect to the substrate SUB as illustrated in FIG. 12. However, the present disclosure is not necessarily limited thereto, and the bank BNK may have sidewalls having a curved surface or a staircase shape. For example, the bank BNK may have a cross-section having a semicircular or semi-elliptical shape.

The electrodes and insulating layers positioned on the bank BNK may have a shape corresponding to the bank BNK. For example, the bank BNK may function as a reflective member that guides light emitted from the light emitting elements LD toward the frontal direction of the pixel PXL, that is, the third direction (Z-axis direction), together with the first and second electrodes ELT1 and ELT2 formed thereon, thereby improving light emission efficiency of the display device.

The bank BNK may include an insulating material including at least one inorganic material and/or at least one organic material. For example, the bank BNK may include at least one inorganic film including one or more suitable inorganic insulating materials, such as silicon nitride ($SiN_x$) and/or silicon oxide ($SiO_x$). In one or more embodiments, the bank BNK may include at least one organic film including one or more suitable types (or kinds) of organic insulating materials and/or a photoresist film, or may include an insulator of a single layer or multiple layers including a combination of organic/inorganic materials. The constituent material and/or pattern shape of the bank BNK may be variously suitably changed.

The first and second electrodes ELT1 and ELT2 may be formed on the bank BNK. The first and second electrodes ELT1 and ELT2 may be spaced apart from each other. The first and second electrodes ELT1 and ELT2 may receive a first alignment signal (or a first alignment voltage) and a second alignment signal (or a second alignment voltage) in an alignment step of the light emitting elements LD, respectively. For example, one of the first and second electrodes ELT1 and ELT2 may receive an AC alignment signal, and the other of the first and second electrodes ELT1 and ELT2 may receive an alignment voltage (e.g., a ground voltage) having a constant voltage level. Therefore, an electric field may be formed between the first and second electrodes ELT1 and ELT2 so that the light emitting elements LD supplied to each of the pixels PXL may be aligned between the first and second electrodes ELT1 and ELT2.

The first electrode ELT1 may be electrically connected (e.g., electrically coupled) to the bridge pattern BRP through the first contact hole CH1, and may be electrically connected (e.g., electrically coupled) to the transistor T therethrough. However, the present disclosure is not necessarily limited thereto, and the first electrode ELT1 may be directly connected (e.g., directly coupled) to a set or predetermined power line or signal line.

The second electrode ELT2 may be electrically connected (e.g., electrically coupled) to the second power line PL2 through the second contact hole CH2. However, the present disclosure is not necessarily limited thereto, and the second electrode ELT2 may be directly connected (e.g., directly coupled) to a set or predetermined power line or signal line.

Each of the first and second electrodes ELT1 and ELT2 may include at least one conductive material. For example, each of the first and second electrodes ELT1 and ELT2 may include at least one metal selected from various suitable metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu); an alloy including the at least one metal; a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and/or fluorine tin oxide (FTO); and/or at least one conductive material of conductive polymers such as PEDOT, but the present disclosure is not limited thereto. For example, the first and second electrodes ELT1 and ELT2 may each independently include a carbon nanotube, graphene, and/or other conductive materials. In one or more embodiments, the first and second electrodes ELT1 and ELT2 may each independently be provided with a single layer or multiple layers. For example, the first and second electrodes ELT1 and ELT2 may each independently include a reflective electrode layer including a reflective conductive material. In one or more embodiments, the first and second electrodes ELT1 and ELT2 may each independently optionally further include at least one transparent electrode layer above and/or below the reflective electrode layer, and at least one conductive capping layer covering the upper portion of the reflective electrode layer and/or the transparent electrode layer.

Referring to FIG. 13, a first insulating layer INS1 is formed, and light emitting elements LD are provided between the first and second electrodes ELT1 and ELT2 on the first insulating layer INS1.

The first insulating layer INS1 may be formed on one region of the first and second electrodes ELT1 and ELT2. The first insulating layer INS1 may be provided with a single layer or multiple layers, and may include at least one inorganic insulating material and/or at least one organic insulating material. For example, the first insulating layer INS1 may include one or more suitable types (or kinds) of organic/inorganic insulating materials, including silicon nitride ($SiN_x$), silicon oxide ($SiO_x$), silicon oxynitride ($SiO_xN_y$), and/or aluminum oxide ($AlO_x$).

The light emitting elements LD may be supplied and aligned between the first and second electrodes ELT1 and ELT2. The light emitting elements LD may be manufactured by the method of manufacturing the light emitting element described above with reference to FIGS. 3 to 11. For example, by curing the polysilazane layer PSL to form the first insulating film INF1, the adhesion, chemical resistance, and moisture resistance of the first insulating film INF1 may be improved. Therefore, as described above, it is possible to improve the lifetime and efficiency of the device by minimizing or reducing the surface defects of the light emitting elements LD.

The light emitting elements LD may be prepared in a form dispersed in a set or predetermined solution, and may be supplied to the emission region of each of the pixels PXL through inkjet printing and/or the like. For example, the light emitting elements LD may be dispersed in a volatile solvent and provided in each light emitting region. At this time, when a set or predetermined voltage is supplied through the first and second electrodes ELT1 and ELT2 of each of the pixels PXL, an electric field may be formed between the first and second electrodes ELT1 and ELT2, and the light emitting elements LD may be aligned between the first and second electrodes ELT1 and ELT2. After the light emitting elements LD are aligned, the solvent is volatilized or removed by other methods to stably arrange the light emitting elements LD between the first and second electrodes ELT1 and ELT2. Although FIG. 13 illustrates one light emitting element LD in each pixel PXL, the pixel PXL may include a plurality of light emitting elements LD provided between the first and second electrodes ELT1 and ELT2. Therefore, hereinafter, it is assumed that the pixel PXL includes a plurality of light emitting elements LD.

Referring to FIG. 14, a second insulating layer INS2, first and second contact electrodes CNE1 and CNE2, a third insulating layer INS3, and a fourth insulating layer INS4 are formed on the light emitting elements LD, thereby completing the display device.

The second insulating layer INS2 may be formed on one region of each of the light emitting elements LD. For example, the second insulating layer INS2 may be formed on one region of each of the light emitting elements LD to expose the first and second end portions EP1 and EP2 of each of the light emitting elements LD. For example, the second insulating layer INS2 may be locally positioned on one region including a central region of each of the light emitting elements LD. When the second insulating layer INS2 is formed on the light emitting elements LD after the alignment of the light emitting elements LD is completed, it is possible to prevent or reduce the deviation of the light emitting elements LD from the aligned positions.

The second insulating layer INS2 may be provided with a single layer or multiple layers, and may include at least one inorganic insulating material and/or at least one organic insulating material. For example, the second insulating layer INS2 may include one or more suitable types (or kinds) of organic/inorganic insulating materials, including silicon nitride ($SiN_x$), silicon oxide ($SiO_x$), aluminum oxide ($AlO_x$), and/or photoresist (PR).

The first and second contact electrodes CNE1 and CNE2 may be formed on both end portions of the light emitting elements LD not covered by the second insulating layer INS2, that is, the first and second end portions EP1 and EP2, respectively. In one or more embodiments, the first and second contact electrodes CNE1 and CNE2 may be sequentially formed in different layers on one surface of the substrate SUB as illustrated in FIG. 14. For example, a third insulating layer INS3 may be between the contact electrodes CNE1 and CNE2 including different conductive layers. However, the order of formation of the first and second contact electrodes CNE1 and CNE2 may be changed according to one or more embodiments. For example, in one or more other embodiments, the second contact electrode CNE2 may be first formed before the first contact electrode CNE1 is formed, the third insulating layer INS3 may be formed to cover the second contact electrode CNE2 and the second insulating layer INS2, and the first contact electrode CNE1 may be formed on the third insulating layer INS3. However, the present disclosure is not necessarily limited thereto, and the first and second contact electrodes CNE1 and CNE2 may include the same conductive layer.

In one or more embodiments, the first and second contact electrodes CNE1 and CNE2 may be on the first and second electrodes ELT1 and ELT2 to cover the exposed region of each of the first and second electrodes ELT1 and ELT2. For example, the first and second contact electrodes CNE1 and CNE2 may be on at least one region of each of the first and second electrodes ELT1 and ELT2, respectively, so as to be electrically connected (e.g., electrically coupled) to the first and second electrodes ELT1 and ELT2 at the upper portion of the bank BNK and/or around the bank BNK. Therefore, the first and second contact electrodes CNE1 and CNE2 may be electrically connected (e.g., electrically coupled) to the first and second electrodes ELT1 and ELT2, respectively. For example, the first electrode ELT1 may be electrically connected (e.g., electrically coupled) to the first end portion EP1 of the adjacent light emitting element LD through the first contact electrode CNE1. In addition, the second electrode ELT2 may be electrically connected (e.g., electrically coupled) to the second end portion EP2 of the adjacent light emitting element LD through the second contact electrode CNE2.

The first and second contact electrodes CNE1 and CNE2 may include one or more suitable transparent conductive materials. For example, the first and second contact electrodes CNE1 and CNE2 may include at least one of transparent conductive materials including indium tin oxide (IZO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and/or fluorine tin oxide (FTO), and may be implemented to be substantially transparent or translucent so as to satisfy a set or predetermined (or desired) transmittance. Therefore, light emitted from the light emitting elements LD through the first and second end portions EP1 and EP2 may pass through the first and second contact electrodes CNE1 and CNE2 and may be emitted to the outside of the display panel.

The third insulating layer INS3 may be formed between the first contact electrode CNE1 and the second contact electrode CNE2. As such, when the third insulating layer INS3 is formed between the first contact electrode CNE1 and the second contact electrode CNE2, the first and second contact electrodes CNE1 and CNE2 are stably separated by the third insulating layer INS3, so that electrical stability between the first and second end portions EP1 and EP2 of the light emitting elements LD is ensured. Therefore, it is possible to effectively prevent or reduce the occurrence of short-circuit defects between the first and second end portions EP1 and EP2 of the light emitting elements LD. The third insulating layer INS3 may be provided with a single layer or multiple layers, and may include at least one inorganic insulating material and/or at least one organic insulating material. For example, the third insulating layer INS3 may include one or more suitable types (or kinds) of organic/inorganic insulating materials, including silicon nitride ($SiN_x$), silicon oxide ($SiO_x$), aluminum oxide ($AlO_x$), and/or photoresist (PR).

A fourth insulating layer INS4 may be formed on the first and second contact electrodes CNE1 and CNE2 and/or the third insulating layer INS3. For example, the fourth insulating layer INS4 may cover the first and second electrodes ELT1 and ELT2, the first, second and/or third insulating layers INS1, INS2, and INS3, the light emitting elements LD, and the first and second contact electrodes CNE1 and CNE2. The fourth insulating layer INS4 may include at least one inorganic film and at least one organic film.

The fourth insulating layer INS4 may be provided with a single layer or multiple layers, and may include at least one inorganic insulating material and/or at least one organic insulating material. For example, the fourth insulating layer INS4 may include one or more suitable types (or kinds) of organic/inorganic insulating materials, including silicon nitride ($SiN_x$), silicon oxide ($SiO_x$), and/or aluminum oxide ($AlO_x$).

In one or more embodiments, the fourth insulating layer INS4 may include a thin film encapsulation layer of a multilayer structure. For example, the fourth insulating layer INS4 may be provided as a thin film encapsulation layer of a multilayer structure including at least two inorganic insulating layers and at least one organic insulating layer between the at least two inorganic insulating layers. However, the present disclosure is not necessarily limited thereto, and the material and/or structure of the fourth insulating layer INS4 may be variously suitably changed. According to one or more embodiments, a color conversion layer and/or a color filter layer may be further formed on the fourth insulating layer INS4, but the present disclosure is not limited thereto.

According to one or more embodiments of the present disclosure, the first insulating film is formed by curing the polysilazane layer, thereby shortening the process time and reducing the cost. In addition, because the adhesion, chemical resistance, and moisture resistance of the first insulating film may be improved, surface defects of the light emitting element may be minimized or reduced to improve lifetime and efficiency.

Effects according to the embodiments of the present disclosure are not limited by the above contents presented above, and more various effects are incorporated in the present specification.

Those of ordinary skill in the technical field related to the present disclosure will appreciate that the present disclosure may be implemented in various modified forms without departing from the essential characteristics of the above description. Therefore, the disclosed methods should be considered from an explanatory viewpoint rather than a limitative viewpoint. The scope of the present disclosure is shown in the claims and their equivalents, rather than the foregoing description, and all differences within the scope equivalent thereto should be construed as falling within the present disclosure.

What is claimed is:

1. A method of manufacturing a light emitting element, the method comprising:

forming a plurality of light emitting patterns on a stack substrate;

forming a polysilazane layer on the plurality of light emitting patterns;

forming a first insulating film by curing the polysilazane layer; and forming a second insulating film on the first insulating film, the second insulating film consisting of at least one selected from the group consisting of aluminum oxide ($AlO_x$), aluminum nitride ($AlN_x$), zirconium oxide ($ZrO_x$), hafnium oxide ($HfO_x$), and titanium oxide ($TiO_x$), wherein a thickness of the second insulating film is about 40 nm to about 200 nm.

2. The method of claim 1, wherein the first insulating film comprises silicon oxide ($SiO_x$).

3. The method of claim 1, wherein the polysilazane layer is formed by slit coating, spin coating, and/or inkjet printing.

4. The method of claim 1, wherein the second insulating film consists of at least one selected from the group consisting of aluminum oxide ($AlO_x$), aluminum nitride ($AlN_x$), and zirconium oxide ($ZrO_x$).

5. The method of claim 1, wherein the second insulating film is formed through a dry process.

6. The method of claim 5, wherein the dry process comprises at least one selected from the group consisting of atomic layer deposition (ALD), physical vapor deposition (PVD), chemical vapor deposition (CVD), and plasma enhanced chemical vapor deposition (PECVD).

7. The method of claim 1, wherein the second insulating film is formed through a wet process.

8. The method of claim 7, wherein the wet process comprises at least one selected from the group consisting of a sol-gel process, a dip coating process, and an electrochemical deposition process.

9. The method of claim 1, wherein the first insulating film is formed to be thinner than the second insulating film.

10. The method of claim 1, further comprising thermally curing the first insulating film.

11. The method of claim 10, wherein the thermally curing is performed at a temperature of about 150° C. to about 500° C.

12. The method of claim 1, wherein the forming of the first insulating film comprises photocuring the polysilazane layer by irradiating ultraviolet rays onto the polysilazane layer.

13. The method of claim 1, wherein the forming of the plurality of light emitting patterns comprises:

forming a light emitting stack structure on the stack substrate; and etching the light emitting stack structure.

14. The method of claim 13, wherein the light emitting stack structure comprises:

a first semiconductor layer;

a second semiconductor layer on the first semiconductor layer; and an active layer between the first semiconductor layer and the second semiconductor layer.

15. A method of manufacturing a display device, the method comprising:

forming a first electrode and a second electrode spaced apart from each other on a substrate; and aligning a light emitting element between the first electrode and the second electrode, wherein the light emitting element is formed by:

forming a plurality of light emitting patterns on a stack substrate;

forming a polysilazane layer on the plurality of light emitting patterns;

forming a first insulating film by curing the polysilazane layer; and forming a second insulating film on the first insulating film, the second insulating film consisting of at least one selected from the group consisting of aluminum oxide ($AlO_x$), aluminum nitride ($AlN_x$), zirconium oxide ($ZrO_x$), hafnium oxide ($HfO_x$), and titanium oxide ($TiO_x$), and wherein a thickness of the second insulating film is about 40 nm to about 200 nm.

16. The method of claim 15, further comprising:

forming a first contact electrode to electrically couple one end of the light emitting element and the first electrode; and forming a second contact electrode to electrically couple another end of the light emitting element and the second electrode.

17. The method of claim 15, wherein each of the plurality of light emitting patterns comprises:

a first semiconductor layer;

a second semiconductor layer on the first semiconductor layer; and an active layer between the first semiconductor layer and the second semiconductor layer.

18. The method of claim 17, wherein the first insulating film directly covers the first semiconductor layer, the second semiconductor layer, and the active layer.

19. The method of claim 15, wherein the first insulating film comprises silicon oxide ($SiO_x$).

20. The method of claim 15, wherein the second insulating film consists of at least one selected from the group consisting of aluminum oxide ($AlO_x$), aluminum nitride ($AlN_x$), and zirconium oxide ($ZrO_x$).

* * * * *